US00RE42917E

(19) United States
(12) Reissued Patent
Hauer et al.

(10) Patent Number: US RE42,917 E
(45) Date of Reissued Patent: Nov. 15, 2011

(54) RF POWER CONTROL DEVICE FOR RF PLASMA APPLICATIONS

(75) Inventors: Frederick Hauer, Windsor, CT (US); Theresa Beizer, Cherry Hill, NJ (US); Anton Mavretic, Natick, MA (US)

(73) Assignee: Advanced Energy Industries, Inc., Fort Collins, CO (US)

(21) Appl. No.: 11/519,242

(22) Filed: Sep. 11, 2006

Related U.S. Patent Documents

Reissue of:
(64) Patent No.: 6,791,274
Issued: Sep. 14, 2004
Appl. No.: 10/620,129
Filed: Jul. 15, 2003

(51) Int. Cl.
*H01J 7/24* (2006.01)
*H01P 5/08* (2006.01)
*C23C 16/00* (2006.01)

(52) U.S. Cl. ..... 315/111.21; 315/111.51; 333/17.3; 118/723 MW

(58) Field of Classification Search ..... 315/111.21, 315/111.51, 111.71, 111.01; 333/17.3, 99 PL, 333/17.1; 118/723 R, 723 MW; 204/155, 204/298.08; 422/906; 427/569, 570
See application file for complete search history.

(56) References Cited

U.S. PATENT DOCUMENTS 5,175,472 A 12/1992 Johnson, Jr.
5,523,955 A * 6/1996 Heckman ..... 702/64
5,654,679 A * 8/1997 Mavretic et al. ..... 333/17.3
5,708,250 A * 1/1998 Benjamin et al. ..... 219/121.58
5,770,922 A 6/1998 Gerrish et al. ..... 315/111.21
5,892,198 A 4/1999 Barnes et al.
5,939,886 A * 8/1999 Turner et al. ..... 324/464
6,020,794 A * 2/2000 Wilbur ..... 333/17.1
6,472,822 B1 * 10/2002 Chen et al. ..... 315/111.21
6,535,785 B2 * 3/2003 Johnson et al. ..... 700/121
6,608,446 B1 * 8/2003 Coumou ..... 315/111.21
(Continued)

FOREIGN PATENT DOCUMENTS

JP 05266990 10/1993
(Continued)

OTHER PUBLICATIONS

Shuichi Miyamoto; Japanese Office Action; Application No. 2006-520335; Dec. 16, 2009; Japanese Patent Office.

(Continued)

*Primary Examiner* — Tuyet Thi Vo
(74) *Attorney, Agent, or Firm* — Neugeboren O'Dowd PC; Sean R. O'Dowd

(57) ABSTRACT

There is provided by this invention an improved rf power control device for plasma applications for optimization of the feedback control voltage in the presence of harmonic and non-harmonic spurious frequencies. In this system, an oscillator and mixer, similar to those normally used in radio receiver applications are placed at the sampled output of the solid state rf signal source used for plasma ignition. The sampled output is mixed to a low frequency and filtered to remove the spurious frequencies that is created in the non-linear plasma. In this way, the feedback power control essentially ignores the spurious frequencies. In this application, the oscillator and mixer do not interfere with other desirable system characteristics and effectively isolate the feedback control voltage from changes in plasma spurious content. This allows rf power to be delivered to the plasma with greater accuracy than would otherwise be possible with conventional power control device and methods.

25 Claims, 4 Drawing Sheets

U.S. PATENT DOCUMENTS

| | | | | |
|---|---|---|---|---|
| 6,703,080 | B2 * | 3/2004 | Reyzelman et al. | 427/445 |
| 6,768,902 | B1 | 7/2004 | Kajita | |
| 6,819,052 | B2 * | 11/2004 | Kitamura et al. | 315/111.21 |
| 2004/0070347 | A1 * | 4/2004 | Nishida et al. | 315/111.21 |
| 2005/0057164 | A1 * | 3/2005 | Kitamura et al. | 315/111.21 |

FOREIGN PATENT DOCUMENTS

| | | |
|---|---|---|
| JP | 10041097 | 2/1998 |
| JP | 2003139804 | 2/2001 |
| JP | 2001044873 | 1/2003 |
| JP | 2003017296 | 5/2003 |

OTHER PUBLICATIONS

Shuichi Miyamoto; Japanese Office Action; Application No. 2006-520335; Jun. 9, 2010; Japanese Patent Office.

Shuichi Miyamoto; Japanese Office Action; Application No. 2006-520335; Jan. 18, 2011; Japanese Patent Office.

Japanese Patent Office, Third Party Observation, Jun. 11, 2010.

Japanese Patent Office, Third Party Observation, Jan. 7, 2011.

* cited by examiner

RF POWER CONTROL DEVICE FOR RF PLASMA APPLICATIONS

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates generally to plasma processing applications utilizing RF power and more particularly to RF power generators used in plasma processing applications having circuitry to improve power delivery characteristics.

2. Brief Description of the Prior Art

Heretofore, RF power generators used in plasma applications have relied on relatively simple diode peak detectors operating from the output of a directional coupler to monitor the power delivered to the plasma However, this method becomes unreliable in the presence of plasma induced spurious frequencies because the diode detectors cannot differentiate between the voltage of the generator output frequency and that of the plasma induced spurious frequencies. Synchronous detection methods have been used to eliminate the effect of spurious frequencies, however the cost and complexity of such a design is generally not acceptable for plasma generator applications. Other power detectors relying on thermal response have also been used. Bandpass filters of various types have been used to eliminate spurious frequencies. However, insertion losses in these filters are difficult to control, particularly when the offending frequency is very close to the generator output frequency.

FIG. 1 shows a typical VHF power generator 10 of the prior art. A rf frequency source 12 supplies power to an amplifier 14 which is fed to a directional coupler 16. The directional coupler 16 is connected to diode detectors 18 and 20. In some designs filters (not shown) are used between the directional coupler 16 and the detectors 18 and 20 to remove spurious frequencies. However, design of these filters is very difficult when the spurious frequencies are very close to the generator output frequency. For example, if the spurious frequency has an amplitude that is higher than the generator output and this signal is close in phase to the output frequency of the generator that is being fed back to monitor the power delivered, the peak diode detectors cannot distinguish between the true feedback signal and the signal of the spurious frequency. Therefore, the detected signals connected to the feedback power control circuitry 22 would be in error. A matching network 24 is connected between the generator 10 and plasma chamber 26 in a typical system application. A second generator 30 coupled through matching network 32 may supply power to the chamber at a different operating frequency.

It would be desirable if there were provided an RF generator that had improved power control stability by isolating the feedback control voltage from the plasma induced spurious frequencies.

Accordingly, it is an object of this invention to provide an improved RF power control method that is easily implemented to replace more expensive and complex designs currently used in the prior art.

It is a further object of this invention to replace the complex narrowband filters as used in prior art with a relatively simple low pass filter to remove the spurious signals.

It is yet another object of this invention to provide a means for using methods other than voltage detection of the generator output for monitoring its power.

It is yet another object of this invention to provide a means for improved matching network tuning in the presence of spurious frequencies.

SUMMARY OF THE INVENTION

There is provided by this invention an improved RF power control method for plasma applications that optimizes the feedback control voltage in the presence of harmonic and non-harmonic spurious caused by interaction between multiple generators acting on the non-linear plasma. In this system, an oscillator and mixer are placed at the sampled output of the solid state RF source used for plasma ignition. The sampled output is mixed to an intermediate frequency and filtered to remove the spurious frequencies that are created in the non-linear plasma. In this way, the feedback power control essentially ignores the spurious frequencies. In this application, the oscillator and mixer do not interfere with other desirable system characteristics and effectively isolate the feedback control voltage from changes in plasma spurious frequency content. This allows RF power to be delivered to the plasma with greater accuracy than would otherwise be possible with conventional power control methods

BRIEF DESCRIPTION OF THE PREFERRED EMBODIMENT

Figure 1:
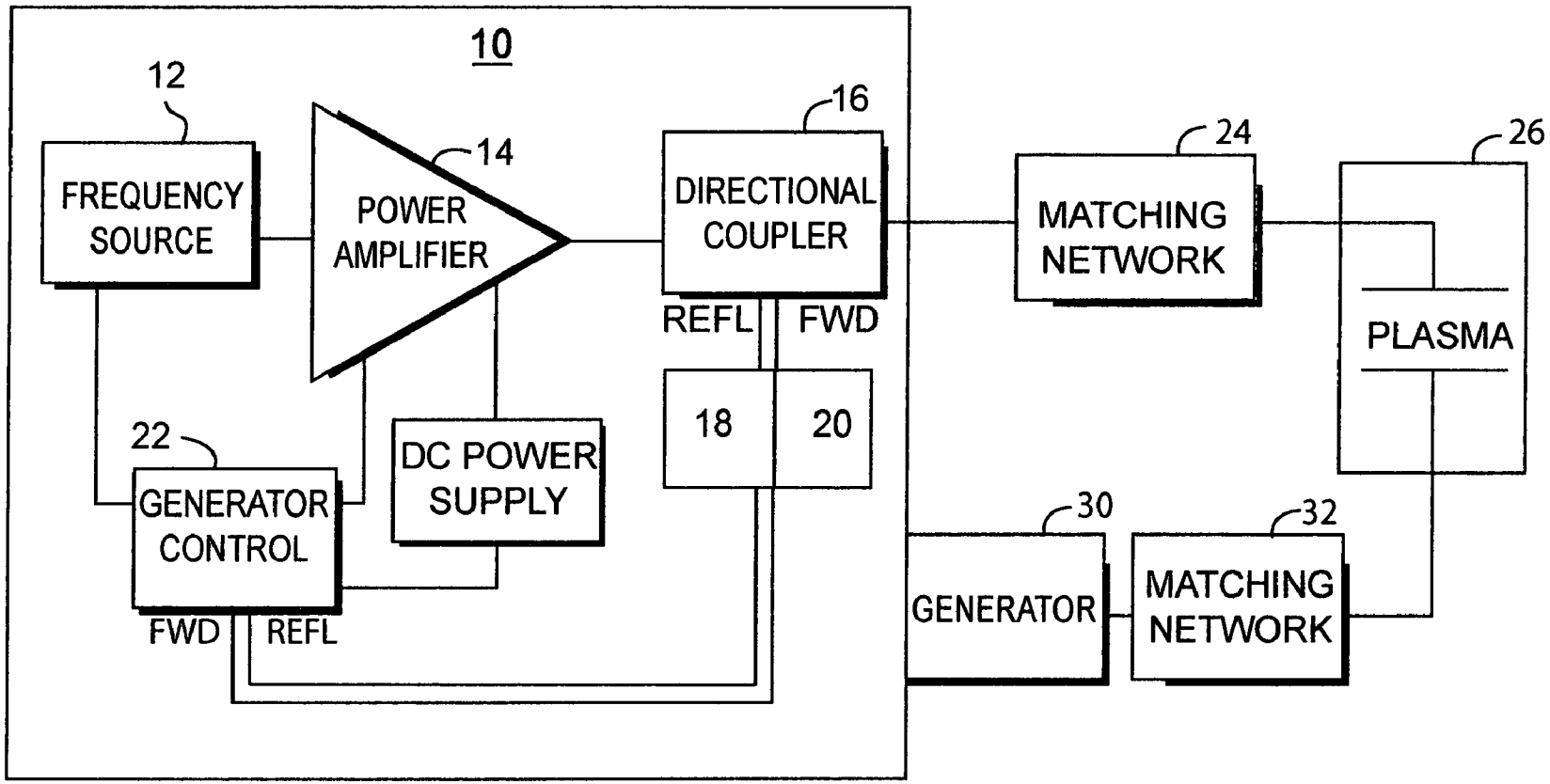
FIGURE 1 (PRIOR ART)
FIG. 1 illustrates a block diagram of a prior art VHF power generator.
Figure 2:
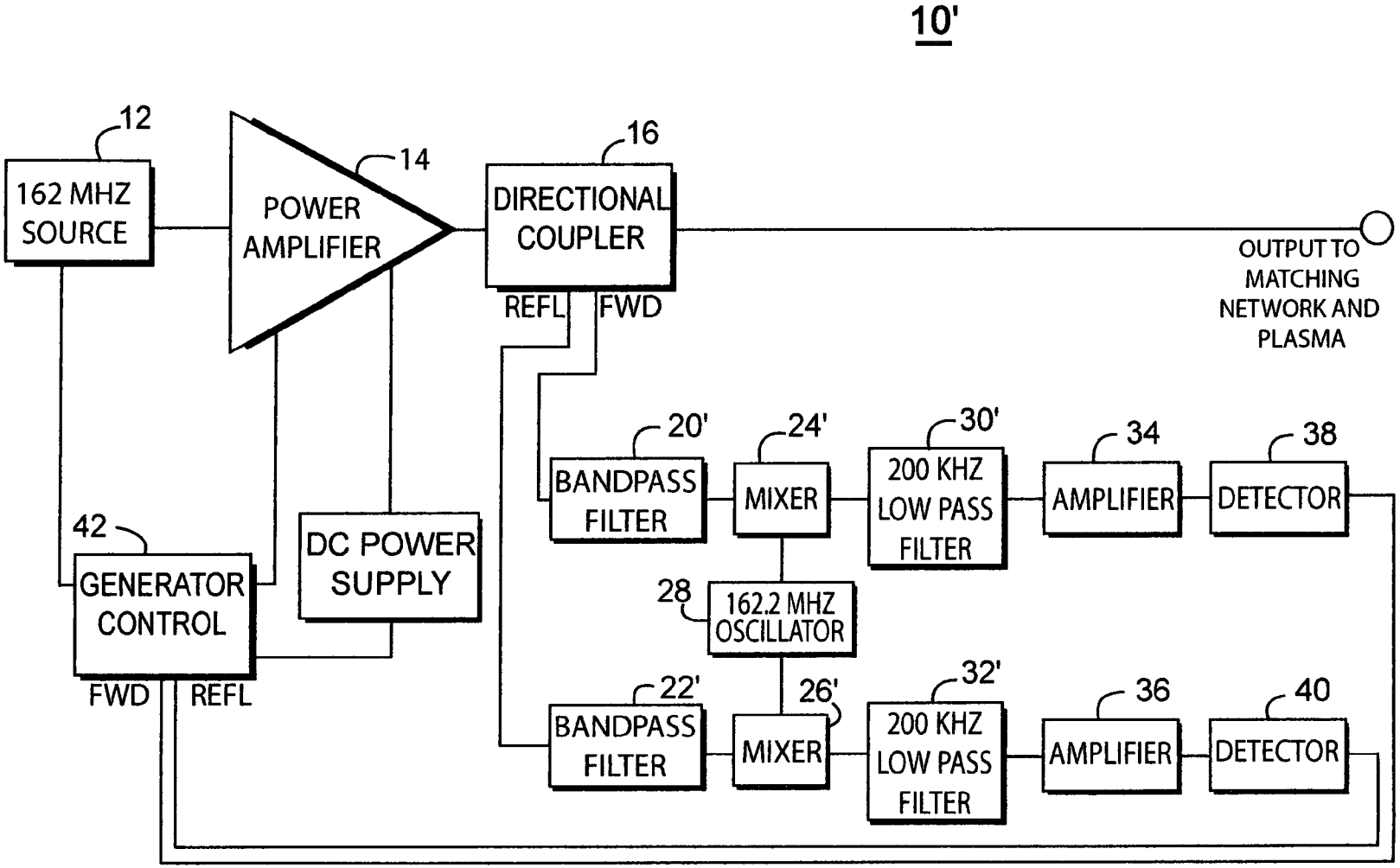
FIG. 2 illustrates a block diagram of a VHF power generator a with generalized heterodyne detector function incorporating the principles of this invention.

There is shown in FIG. 2 a VHF generator 10' that incorporates the principles of this invention that detects and monitors the power delivered to plasma in a plasma processing system such as that shown FIG. 1. In this preferred embodiment a 162 MHz rf source 12 is connected to the power amplifier 14 and sends power to the directional coupler 16. Sampled 162 MHz forward and reflected signals are taken from the directional coupler 16 and injected into the detector circuit where these signals are mixed with a base frequency. The detector circuit is comprised of band pass filters 20', 22', mixers 24', 26'; and a heterodyne oscillator 28. The mixed frequencies are passed through low pass filters 30' and 32' there they are amplified by amplifiers 34 and 36 and detected by detectors 38 and 40. The detected signals are then fed back to a generator control circuit 42. This heterodyne detection circuit allows the output of the generator at 18 to be constantly adjusted for changing plasma conditions. The detector circuit is capable of taking several options for the oscillator frequency, with appropriate change in filtering.

For this description, assume that the oscillator frequency is 162.2 MHz. A signal at the oscillator frequency is mixed (heterodyned) with the sensed forward and reflected power signals. This explanation describes only the forward power signal. The reflected power signal is treated in exactly the same way. The forward power signal has frequency components as follows, $$P_{Fwd}=V(f_0,2f_0,3f_0,\ldots,f_0+f_1,f_0-f_1,f_0+2f_1,f_0-2f_1,\ldots)$$

where, $f_0$=fundamental frequency (In our case this is 162 MHz).

$2f_0=2^{nd}$ Harmonic of the fundamental frequency.

$3f_0=3^{rd}$ Harmonic of the fundamental frequency.

$f_1$=Second frequency (2 MHz in this case).

Thus the forward power signal may contain frequency components of 162 MHz, 324 MHz, 486 MHz, 648 MHz, 810 MHz, . . . etc.

When a signal with the above spectrum is mixed with the oscillator frequency at 162.2 MHz, the mixed products are generated according to the following trigonometric formula, $$\cos\alpha\cos\beta=\tfrac{1}{2}\cos(\alpha-\beta)+\tfrac{1}{2}\cos(\alpha+\beta)$$

Thus the mixed frequencies are at 200 kHz, 161.8 MHz, 164 MHz, 323.8 MHz, etc. This spectrum is then filtered through the low pass filters 30',32' that only allows the 200 KHz signal to pass through. Thus at the output of these filters there is a signal that has the same amplitude information as the sensed 162 MHz forward and reflected power signals. However, since it is filtered, it is insensitive to any other mixed frequencies, including harmonics of 162 MHz, 2 MHz sidebands, or any other chamber induced frequency that is sufficiently apart from the 162 MHz signal. The power detector may be designed for either fixed frequency or variable frequency generator operation.

FIG. 2 shows the heterodyne detector connected between the directional coupler in place of the conventional diode detector. The power control circuitry within the generator is effectively isolated by the heterodyne detector from changes in the spurious content of the waveform at the output of the generator and always senses only the generator output power. This results in improved plasma stability and more consistent process results. The power control is optimized for operation at the output frequency without compromises needed to maintain power control accuracy in the presence of spurious. It is understood that the mixers and filters shown may be of the active or passive type and the filters may use either lumped element or distributed components.

The directional coupler forward and reflected power samples are band pass filtered to remove harmonics and low frequency spurious ahead of the mixers. It is understood that the output of the 162.2 MHz oscillator is filtered to reduce its harmonics. The outputs of the mixers are passed through 200 kHz filters. Other oscillator frequencies may be used to produce filter frequencies other than 200 kHz as long as the unwanted spurious frequencies appear outside the filter band pass. The filter output is amplified, detected, and used in the normal way for feedback power control of the generator.

Figure 3:
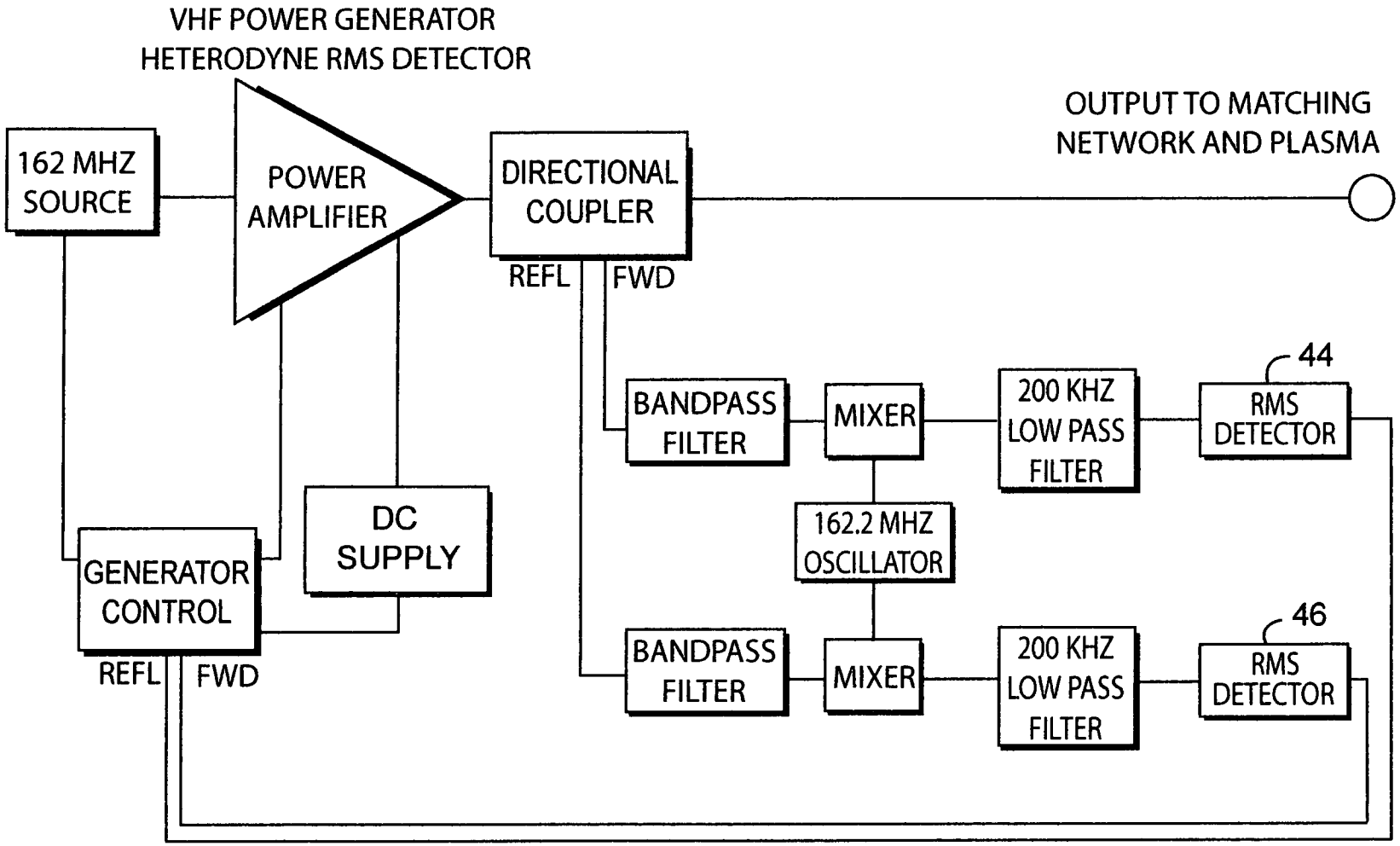
FIG. 3 illustrates a block diagram of a VHF power generator with a heterodyne detector function utilizing a rms detector.

FIG. 3 illustrates another embodiment that utilizes true RMS detectors 44 and 46 in place of the diode detectors. The block diagram of FIG. 3 shows such detectors operating directly on the 200 kHz waveform.

Figure 4:
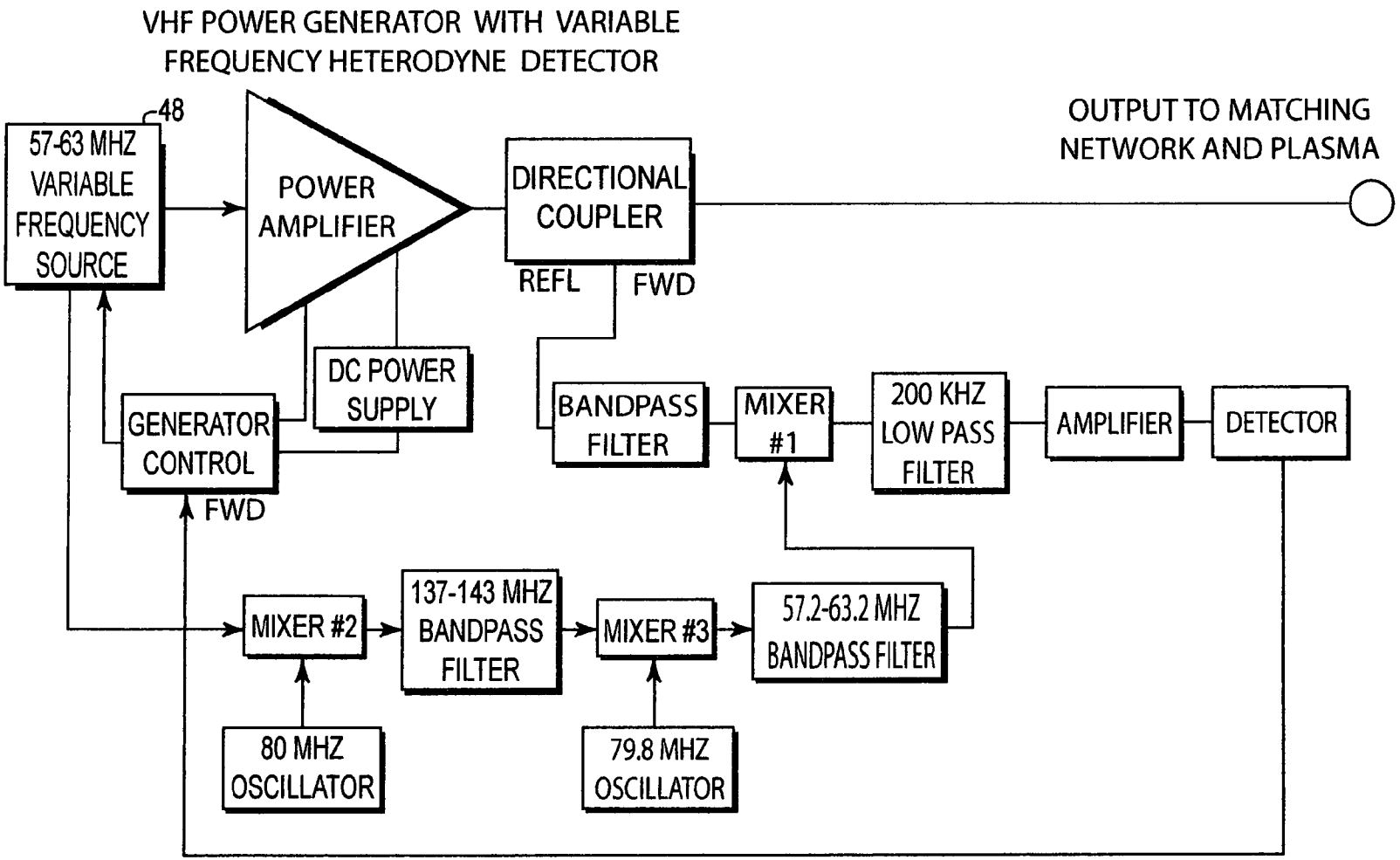
FIG. 4 illustrates a block diagram of a VHF power generator with a variable frequency heterodyne detector.

Still another embodiment derives the oscillator frequency from the generator variable frequency source, thus allowing the heterodyne detector to track the variable output frequency of the generator. The block diagram of this embodiment is shown in FIG. 4. A 57-63 MHz MHz application is shown. The output of the variable frequency source 48 is mixed with an 80 MHz signal to give 137-143 MHz. This is filtered and mixed with 79.8 MHz down to 57.2-63.2 MHz. This signal is then mixed with the original 57-63 MHz to provide the necessary 200 kHz for the low pass filter and the detector circuit.

It is understood that suitable amplification may be used along the signal path to compensate for losses that occur during the frequency conversion process. It is further understood that although only the Forward power sample from the directional coupler is shown, the reflected power sample may be detected in the same way. It is still further understood that the variable frequency injected into Mixer #1 may be derived by other means, such as an additional output of the generator variable frequency source.

It will be further understood that, although the invention is described for a VHF application, it may be used at any frequency for the purpose of detecting and controlling generator output power. It will be still further understood that, although power control and metering is discussed as being internal to the generator, it may be accomplished by any number of means and be either internal or external to the generator as well as be controlled by a system CPU. It will be still further understood that detailed schematic diagrams have been eliminated for the purpose of clarity. It will be still further understood that the improved power detector may be used to accurately control power from any or all generators operating on the plasma.

The invention has been described in detail with particular reference to a preferred embodiment. It will be understood that variations and modifications in addition to those described can be effected within the spirit and scope of the invention. It will be further understood that changes, alterations, modifications, or substitutions can be made in the structure of the apparatus in accordance with the invention without departing from the spirit and scope of the invention.

We claim:

1. A VHF generator for delivering rf power to a plasma, comprising, a) a variable rf signal generator including a power amplifier connected to a directional coupler;

b) the directional coupler having one output connected to a matching network wherein power is delivered to plasma in a processing chamber;

c) at least one output of the directional coupler disposed to sample a forward power signal of the rf signal generator and at least one output of the directional coupler disposed to sample a reflected power signal of the rf signal generator;

d) each of the sampled forward and reflected signals is connected to mixers for mixing with an intermediate frequency of an oscillator;

e) the mixed forward and reflected signals are passed through low pass filters;

f) the filtered forward and reflected signals are connected to amplifiers and detectors; and g) the detected forward and reflected signals are fed back to a power control circuit wherein the power delivered to the plasma is monitored without interference from spurious frequency signals generated by the plasma.

2. A VHF generator for delivering rf power to a plasma as recited in claim 1 wherein forward and reflected bandpass filters are connected between the output of the directional coupler and the mixers for removing harmonics and spurious low frequency signals.

3. A VHF generator for delivering rf power to a plasma as recited in claim 2 wherein the detectors are diode detectors.

4. A VHF generator for delivering rf power to a plasma as recited in claim 2 wherein the detectors are RMS detectors.

5. A VHF generator for delivering rf power to a plasma, comprising, a) an rf signal generator including a power amplifier connected to a directional coupler;

b) the directional coupler having one output connected to a matching network wherein power is delivered to plasma in a processing chamber;

c) at least one output of the directional coupler disposed to sample a forward power signal of the rf signal generator and at least one output of the directional coupler disposed to sample a reflected power signal of the rf signal generator;

d) each of the sampled forward and reflected signals is connected to a first mixer;

e) a first oscillator connected to a second mixer for mixing a sampled output of the variable rf signal generator with a first intermediate frequency;

f) the output of the second mixer is connected to a first band pass filter and then connected to a third mixer for mixing with a second intermediate frequency of a second oscillator;

g) the output of the third mixer is connected to a second band pass filter and connected to the first mixer;

h) the mixed forward and reflected signals are passed through low pass filters;

i) the filtered forward and reflected signals are connected to amplifiers and detectors; and j) the detected forward and reflected signals are fed back to a power control circuit wherein the power delivered to the plasma is monitored without interference from spurious frequency signals generated by the plasma.

6. A VHF generator for delivering rf power to a plasma as recited in claim 5 wherein forward and reflected bandpass filters are connected between the output of the directional coupler and the first mixer for removing harmonics and spurious low frequency signals.

7. A VHF generator for delivering rf power to a plasma as recited in claim 6 wherein the detectors are diode detectors.

8. A VHF generator for delivering rf power to a plasma as recited in claim 6 wherein the detectors are RMS detectors.

*9. An apparatus for delivering RF power to a plasma, comprising:*

*a. an RF power source that delivers power to a plasma in a processing chamber; and*

*b. an output sampler disposed between the RF power source and the plasma, the output sampler disposed to sample at least one output characteristic of the RF power source and thereby generate at least one output signal; wherein the output signal is mixed with an oscillator frequency to generate a mixed signal, the mixed signal processed to generate a filtered mixed signal, and the filtered mixed signal fed back to a control circuit for controlling the RF power source.*

*10. The apparatus of claim 9 wherein the output sampler is a directional coupler.*

*11. The apparatus of claim 9 wherein the output characteristic is one of forward or reflected power.*

*12. The apparatus of claim 9, further comprising a matching network disposed between the output sampler and the plasma.*

*13. The apparatus of claim 9 wherein the RF power source is a VHF generator.*

*14. The apparatus of claim 9 wherein the RF power source is a variable frequency RF power source.*

*15. The apparatus of claim 10, further comprising forward and reflected band pass filters disposed at the output of the directional coupler for removing harmonics and spurious low frequency signals.*

*16. The apparatus of claim 15 wherein the filters are connected to detectors that monitor the power delivered to the plasma.*

*17. The apparatus of claim 16 wherein the detectors are RMS detectors.*

*18. A method of delivering RF power to a plasma, comprising,*

*a. providing an RF power source that delivers power to a plasma in a processing chamber;*

*b. providing an output sampler between the RF power source and the plasma;*

*c. sampling at least one output characteristic of the RF power source using the output sampler, thereby generating at least one output signal;*

*d. mixing the output signal with an oscillator frequency to generate a mixed signal;*

*e. processing the mixed signal to generate a filtered mixed signal; and*

*f. using the filtered mixed signal to control the RF power source.*

*19. The method of claim 18 wherein the output sampler is a directional coupler.*

*20. The method of claim 18 wherein the output characteristic is one of forward or reflected power.*

*21. The method of claim 18 wherein the RF power source is a VHF generator.*

*22. The method of claim 18 wherein the RF power source is a variable frequency RF generator.*

*23. The method of claim 19, further comprising providing forward and reflected band pass filters disposed at the output of the directional coupler for removing harmonics and spurious low frequency signals.*

*24. The method of claim 23 wherein the filters are connected to detectors to monitor the power delivered to the plasma.*

*25. The method of claim 24 wherein the detectors are RMS detectors.*

* * * * *